(12) United States Patent
Hsiao et al.

(10) Patent No.: US 9,228,260 B1
(45) Date of Patent: Jan. 5, 2016

(54) WAFER PROCESSING CHAMBER, HEAT TREATMENT APPARATUS AND METHOD FOR PROCESSING WAFERS

(71) Applicant: TAIWAN SEMICONDUCTOR MANUFACTURING CO., LTD., Hsinchu (TW)

(72) Inventors: Tsai-Fu Hsiao, Hsinchu (TW); Chun-Yao Wang, Zhubei (TW); Tai-Chun Huang, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/447,403

(22) Filed: Jul. 30, 2014

(51) Int. Cl.
  *H01L 21/26* (2006.01)
  *H01L 21/42* (2006.01)
  *C23C 16/44* (2006.01)
  *C23C 16/455* (2006.01)
  *H01L 21/67* (2006.01)

(52) U.S. Cl.
  CPC ........... *C23C 16/4412* (2013.01); *C23C 16/455* (2013.01); *H01L 21/67098* (2013.01)

(58) Field of Classification Search
  CPC ............. H01L 21/02126; H01L 21/3223; H01L 21/67098; H01L 21/02214; H01L 21/02219; H01L 21/02263; H01L 21/0228; H01L 21/02312; H01L 21/02323; H01L 21/2026; H01L 21/28202; H01L 21/32136; H01L 21/76876; H01L 21/0262; C23C 16/0218; C23C 16/453; C30B 23/06; C30B 23/063; C30B 31/12
  USPC ......... 438/513, 680, 509, 474, 475, 423, 502, 438/503, 507, 535, 905; 257/E21.077, 257/E21.134, E21.135, E21.17, E21.311, 257/E21.319, E21.324
  See application file for complete search history.

(56) References Cited

U.S. PATENT DOCUMENTS

| | | | | |
|---|---|---|---|---|
| 6,821,910 B2 * | 11/2004 | Adomaitis et al. | ............ | 438/758 |
| 7,452,827 B2 * | 11/2008 | Gianoulakis et al. | ......... | 438/778 |
| 7,481,886 B2 * | 1/2009 | Kato et al. | ................... | 118/715 |
| 8,182,608 B2 * | 5/2012 | Kerr et al. | ..................... | 118/719 |
| 8,366,828 B2 * | 2/2013 | Iizuka | ........................... | 118/715 |
| 2009/0236041 A1 * | 9/2009 | Iizuka | ...................... | 156/345.34 |

* cited by examiner

*Primary Examiner* — David Nhu
(74) *Attorney, Agent, or Firm* — Maschoff Brennan

(57) ABSTRACT

A wafer processing chamber is provided, including a first processing gas supply unit and a second processing gas supply unit. The first processing gas supply unit is configured for supplying a first processing gas to form a first processing zone in the wafer processing chamber. The second processing gas supply unit is configured for supplying a second processing gas into the wafer processing chamber to form a second processing zone in the wafer processing chamber. In the wafer processing chamber, the first processing zone and the second processing zone are virtually separated from each other, such that a process wafer in the first processing zone may be performed a different process from another process wafer in the second processing zone at the same time. Further, a heat treatment apparatus and a method for processing wafers also provide herein.

20 Claims, 10 Drawing Sheets

WAFER PROCESSING CHAMBER, HEAT TREATMENT APPARATUS AND METHOD FOR PROCESSING WAFERS

BACKGROUND

Generally, in manufacturing semiconductor devices, the semiconductor devices are formed on a semiconductor wafer by performing various types of processes such as heat treatments. The heat treatments include oxidation, diffusion, chemical vapor deposition (CVD), annealing and so on.

A heat treatment apparatus may be used to process the heat treatment of a batch of wafers at a time. The heat treatment apparatus includes a processing chamber, which is configured to accommodate a wafer holder loaded with the wafers. The wafers in the processing chamber are treated by supplying a processing gas injected into the processing chamber, and residual processing gas after the heat treatment is together exhausted from the processing chamber.

However, in the processing chamber, the processing gas can be only supplied to process the whole batch of the wafers. Accordingly, improvements in the heat treatment apparatus and methods for processing wafers continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
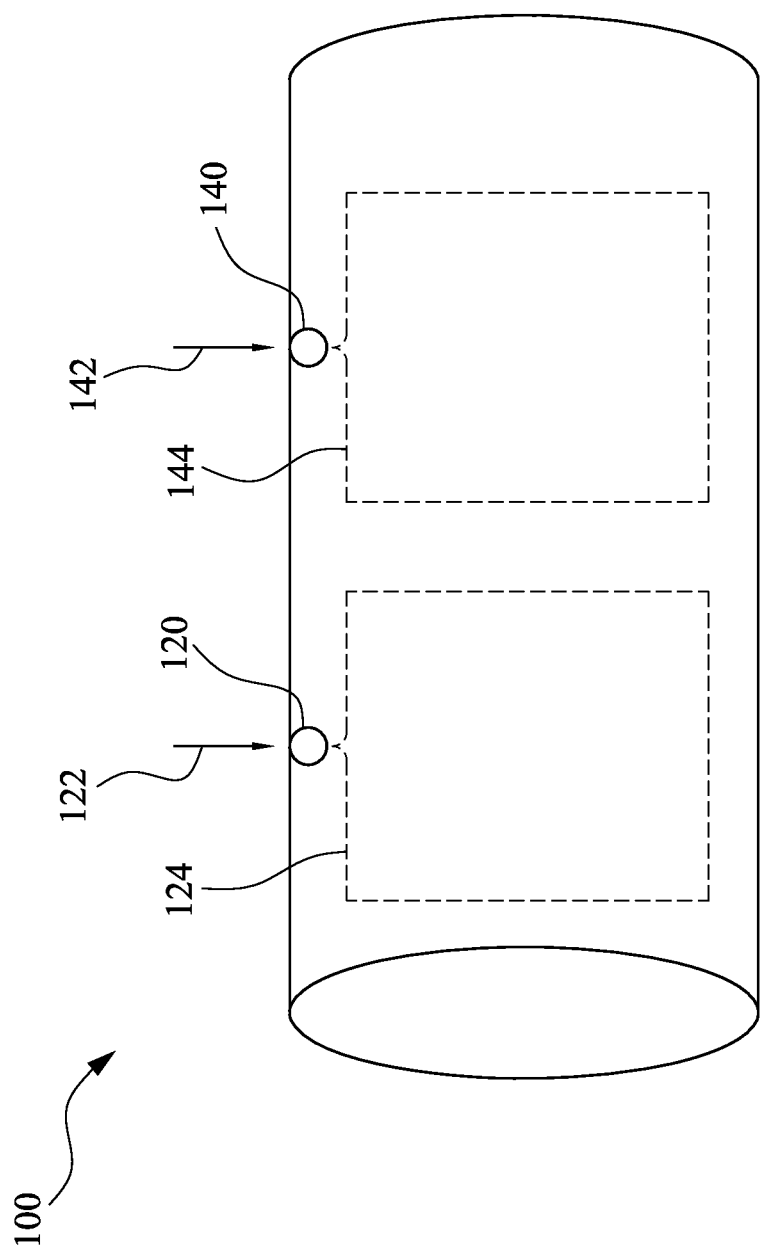
FIG. 1 is a schematic cross-sectional view of a wafer processing chamber, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

As aforementioned, in the conventional heat treatment apparatus, the process gas is supplied for processing a batch of process wafers in the processing chamber, process variations between different semiconductor wafers cannot be performed at the same time, and the time cost and the product cost of processing different wafers may be significantly increased.

According to various embodiments of the present disclosure, a processing chamber, a heat treatment apparatus and a method for processing wafers are provided. FIG. 1 is a schematic cross-sectional view of a wafer processing chamber 100, in accordance with some embodiments. In FIG. 1, the wafer processing chamber 100 includes a first processing gas supply unit 120 and a second processing gas supply unit 140.

The first processing gas supply unit 120 is for supplying a first processing gas 122 into the wafer processing chamber 100. According to some embodiments, the first processing gas supply unit is arranged inside the wafer processing chamber. According to some embodiments, the first processing gas supply unit is a first gas supply nozzle arranged on an inner wall of the wafer processing chamber.

The first processing gas 122 supplied from the first processing gas supply unit 120 forms a first processing zone 124 in the wafer processing chamber 100. According to some embodiments, the first processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

The second processing gas supply unit 140 is for supplying a second processing gas 142 into the wafer processing chamber 100. According to some embodiments, the second processing gas supply unit is arranged inside the wafer processing chamber. According to some embodiments, the second processing gas supply unit is a second gas supply nozzle arranged on an inner wall of the wafer processing chamber.

The second processing gas 142 supplied from the second processing gas supply unit 140 forms a second processing zone 144 in the wafer processing chamber 100. According to some embodiments, the second processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

In the wafer processing chamber 100, the first processing zone 124 and the second processing zone 144 are virtually separated from each other. According to some embodiments, as the first processing zone and the second processing zone are separated from each other in the same heat treatment apparatus, a process wafer in the first processing zone may be performed a different process from another process wafer in the second processing zone at the same time.

According to some embodiments, the wafer processing chamber further includes a separation unit arranged between the first processing zone and the second processing zone. For example, the separation unit is an inactive gas supply unit for supplying an inactive gas to separate the first processing zone and the second processing zone. According to some embodiments, the inactive gas is a noble gas including, but not limited to, nitrogen ($N_2$), helium (He), neon (Ne), argon (Ar), krypton (Kr), xenon (Xe) or a combination thereof.

In FIG. 1, the first processing gas supply unit 120 and the second processing gas supply unit 140 are arranged horizontally, such that the first processing zone 124 and the second processing zone 144 are also arranged horizontally. According to some embodiments, the processing chamber further includes a gas exhaust unit formed opposite to the first and second processing gas supply unit, for exhausting the first processing gas and the second processing gas.

Figure 2:
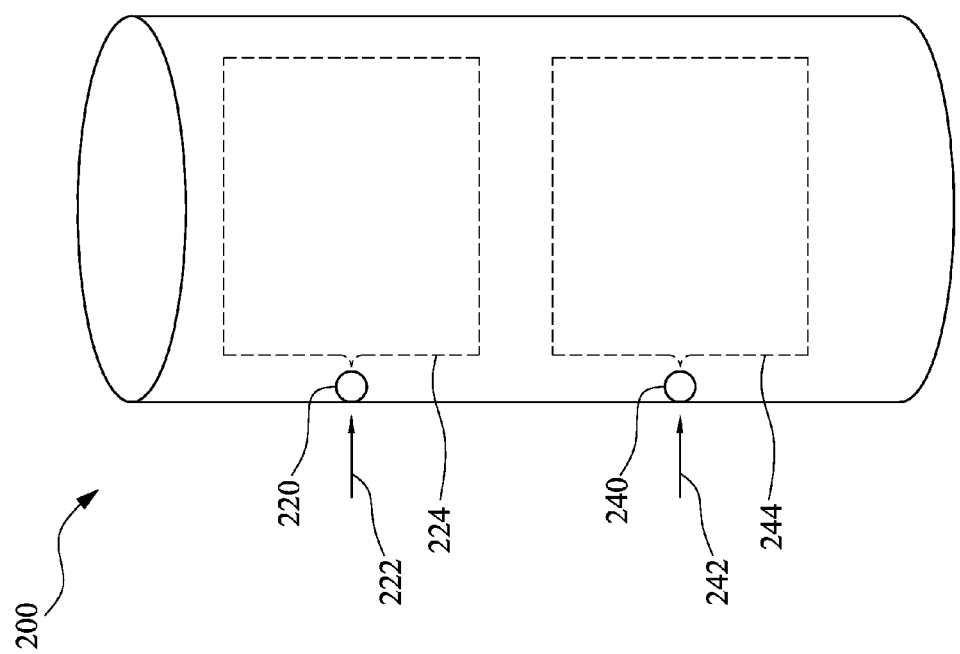
FIG. 2 is a schematic cross-sectional view of a wafer processing chamber, in accordance with some embodiments.

Referring to FIG. 2, FIG. 2 is a schematic cross-sectional view of a wafer processing chamber 200, in accordance with some embodiments. In FIG. 2, the wafer processing chamber 200 includes a first processing gas supply unit 220 and a second processing gas supply unit 240.

The first processing gas supply unit 220 is for supplying a first processing gas 222 into the wafer processing chamber 200. According to some embodiments, the first processing gas supply unit is arranged inside the wafer processing chamber. According to some embodiments, the first processing gas supply unit is a first gas supply nozzle arranged on an inner wall of the wafer processing chamber.

The first processing gas 222 supplied from the first processing gas supply unit 220 forms a first processing zone 224 in the wafer processing chamber 200. According to some embodiments, the first processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

The second processing gas supply unit 240 is for supplying a second processing gas 242 into the wafer processing chamber 200. According to some embodiments, the second processing gas supply unit is arranged inside the wafer processing chamber. According to some embodiments, the second processing gas supply unit is a second gas supply nozzle arranged on an inner wall of the wafer processing chamber.

The second processing gas 242 supplied from the second processing gas supply unit 240 forms a second processing zone 244 in the wafer processing chamber 200. According to some embodiments, the second processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

In the wafer processing chamber 200, the first processing zone 224 and the second processing zone 244 are virtually separated from each other. According to some embodiments, as the first processing zone and the second processing zone are separated from each other in the same heat treatment apparatus, a process wafer in the first processing zone may be performed a different process from another process wafer in the second processing zone at the same time.

According to some embodiments, the wafer processing chamber further includes a separation unit arranged between the first processing zone and the second processing zone. For example, the separation unit is an inactive gas supply unit for supplying an inactive gas to separate the first processing zone and the second processing zone. According to some embodiments, the inactive gas is a noble gas including, but not limited to, nitrogen ($N_2$), helium (He), neon (Ne), argon (Ar), krypton (Kr), xenon (Xe) or a combination thereof.

In FIG. 2, the first processing gas supply unit 220 and the second processing gas supply unit 240 are arranged vertically, such that the first processing zone 224 and the second processing zone 244 are also arranged vertically. According to some embodiments, the processing chamber further includes a gas exhaust unit formed opposite to the first and second processing gas supply unit, for exhausting the first processing gas and the second processing gas.

Figure 3A:
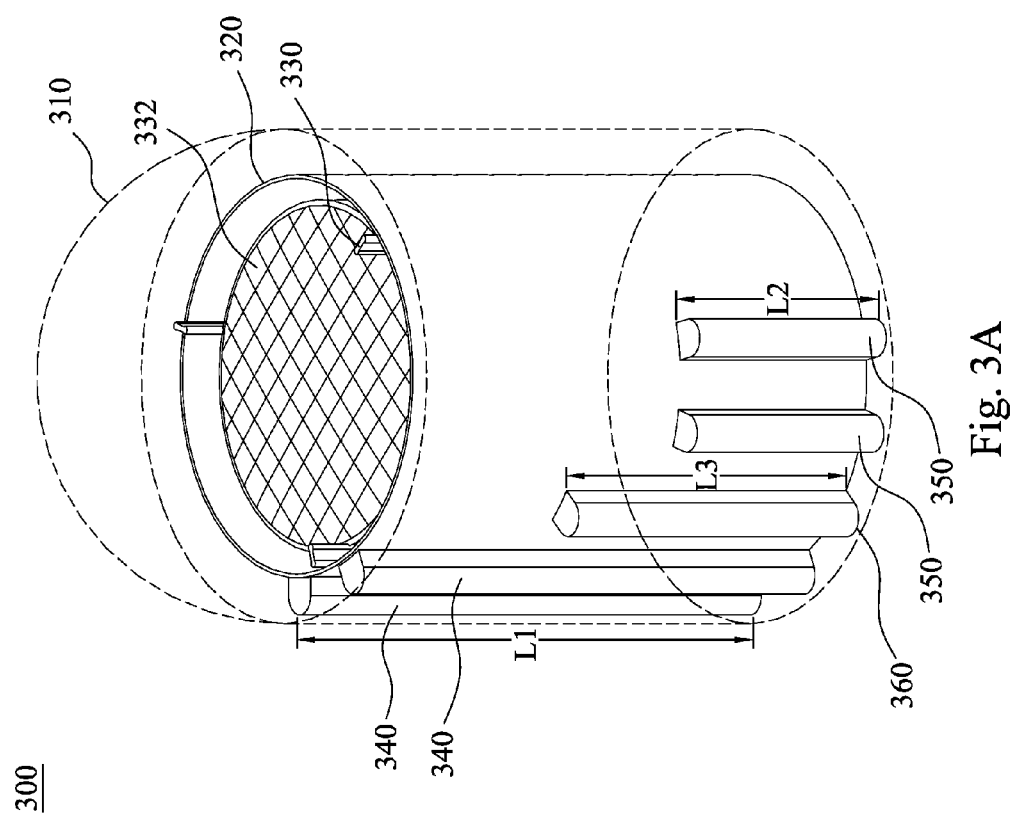
FIG. 3A is a schematic view of a heat treatment apparatus, in accordance with some embodiments.
Figure 3B:
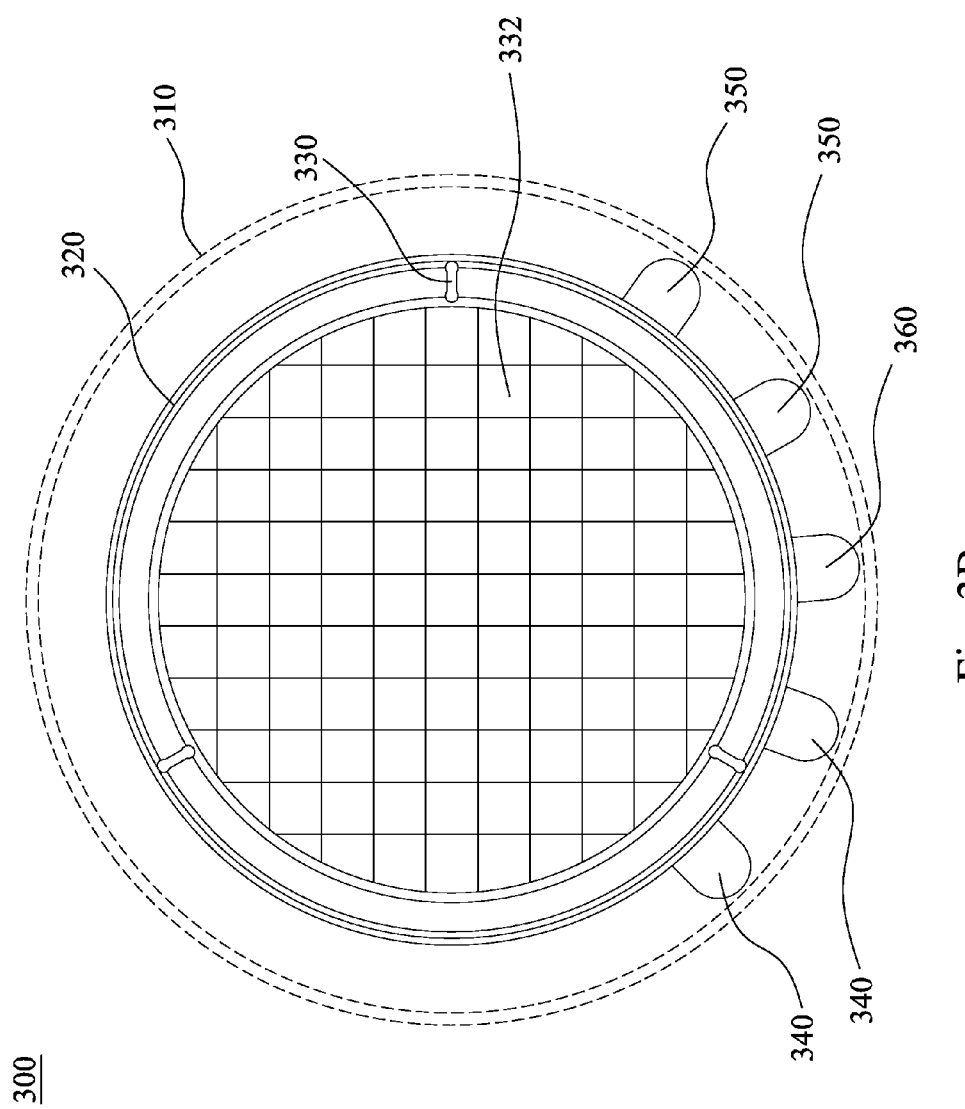
FIG. 3B is a top view of a heat treatment apparatus, in accordance with some embodiments.

FIG. 3A is a schematic view of a heat treatment apparatus 300, in accordance with some embodiments; and FIG. 3B is a top view of a heat treatment apparatus, in accordance with some embodiments. In FIG. 3B, the heat treatment apparatus 300 includes an outer tube 310, an inner tube 320, a first gas injector 340 and a second gas injector 350.

The inner tube 320 is in the outer tube 310. In FIG. 3A, the inner tube 320 is further configured to accommodate a wafer carrier 330 for holding a plurality of process wafers 332. The first gas injector 340 is positioned between the outer tube 310 and the inner tube 320, and the second gas injector 350 is positioned between the outer tube 310 and the inner tube 320.

Referring to FIG. 3A, the first gas injector 340 and the second gas injector 350 are arranged vertically, and the first gas injector 340 is higher than the second gas injector 350. According to some embodiments, a length (L1) of the first gas injector 340 is longer than a length (L2) of the second gas injector 350.

In FIG. 3B, the heat treatment apparatus 300 further includes an inactive gas injector 360 positioned between the outer tube 310 and the inner tube 320. Referring to FIG. 3A, a length (L3) of the inactive gas injector 360 is in a range between the first gas injector 340 and the second gas injector 350. In fact, the length (L1) of the first gas injector 340 is longer than the length (L3) of the inactive gas injector 360, and the length (L3) of the inactive gas injector 360 is longer than the length (L2) of the second gas injector 350, in accordance with some embodiments.

Figure 3C:
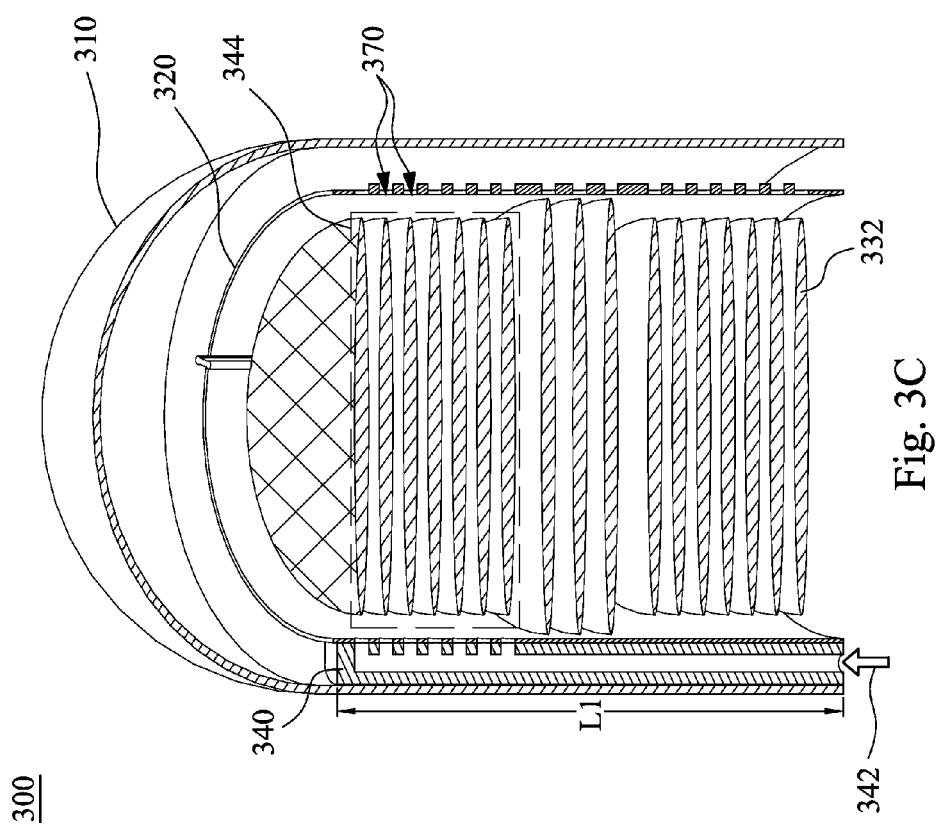
FIG. 3C is a schematic cross-sectional view of a heat treatment apparatus, in accordance with some embodiments.

FIG. 3C is a schematic cross-sectional view of the heat treatment apparatus 300, in accordance with some embodiments. In FIG. 3C, the first gas injector 340 is for supplying a first processing gas 342 to form a first processing zone 344 in the inner tube 320. According to some embodiments, the first processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

In FIG. 3C, the heat treatment apparatus 300 further includes gas exhaust holes 370 on inner tube 320 beside each process wafer 332. According to some embodiments, the gas exhaust holes 370 are arranged opposite to the first gas injector 340, for exhausting the first processing gas 342.

Figure 3D:
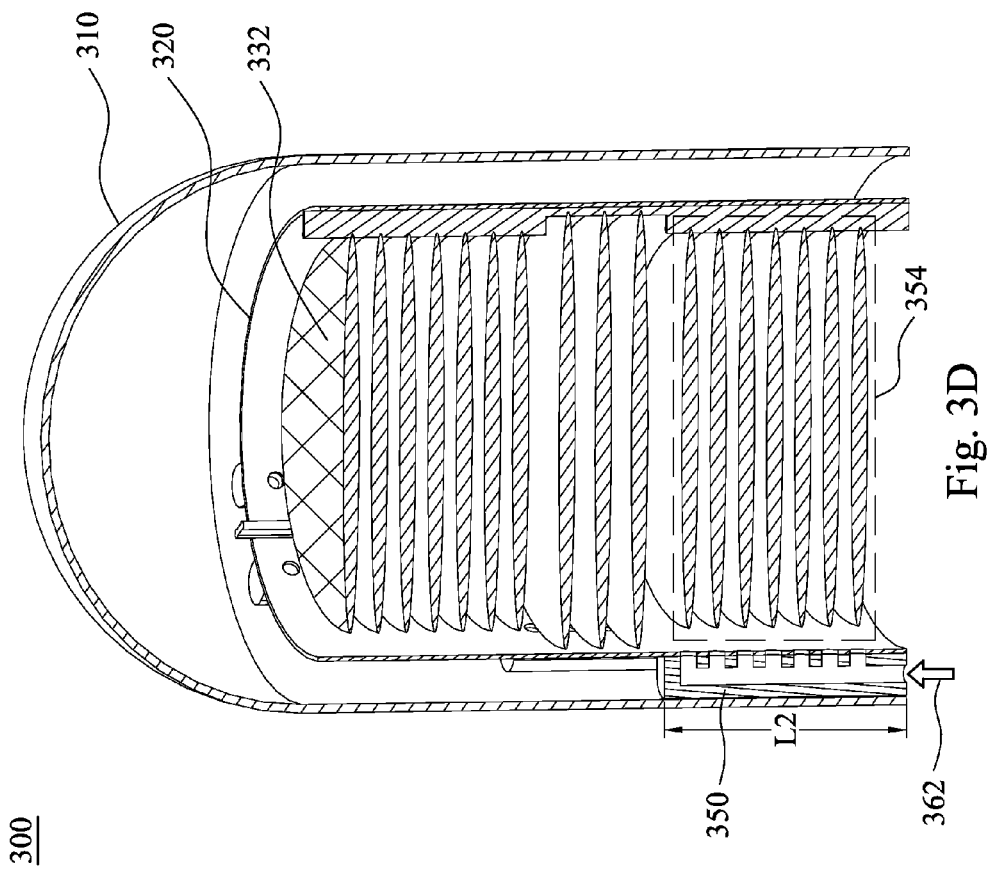
FIG. 3D is a schematic cross-sectional view of a heat treatment apparatus, in accordance with some embodiments.

FIG. 3D is a schematic cross-sectional view of the heat treatment apparatus 300, in accordance with some embodiments. In FIG. 3D, the second gas injector 350 is for supplying a second processing gas 352 to form a second processing zone 354 in the inner tube 320. According to some embodiments, the second processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

According to some embodiments, the gas exhaust holes 370 are arranged opposite to the second gas injector 350, for exhausting the second processing gas 352.

Referring to FIGS. 3C and 3D, the first gas injector 340 is higher than the second gas injector 350, and the length (L1) of the first gas injector 340 is longer than the length (L2) of the second gas injector 350, so that the first processing zone 344 and the second processing zone 354 are virtually separated from each other.

Figure 3E:
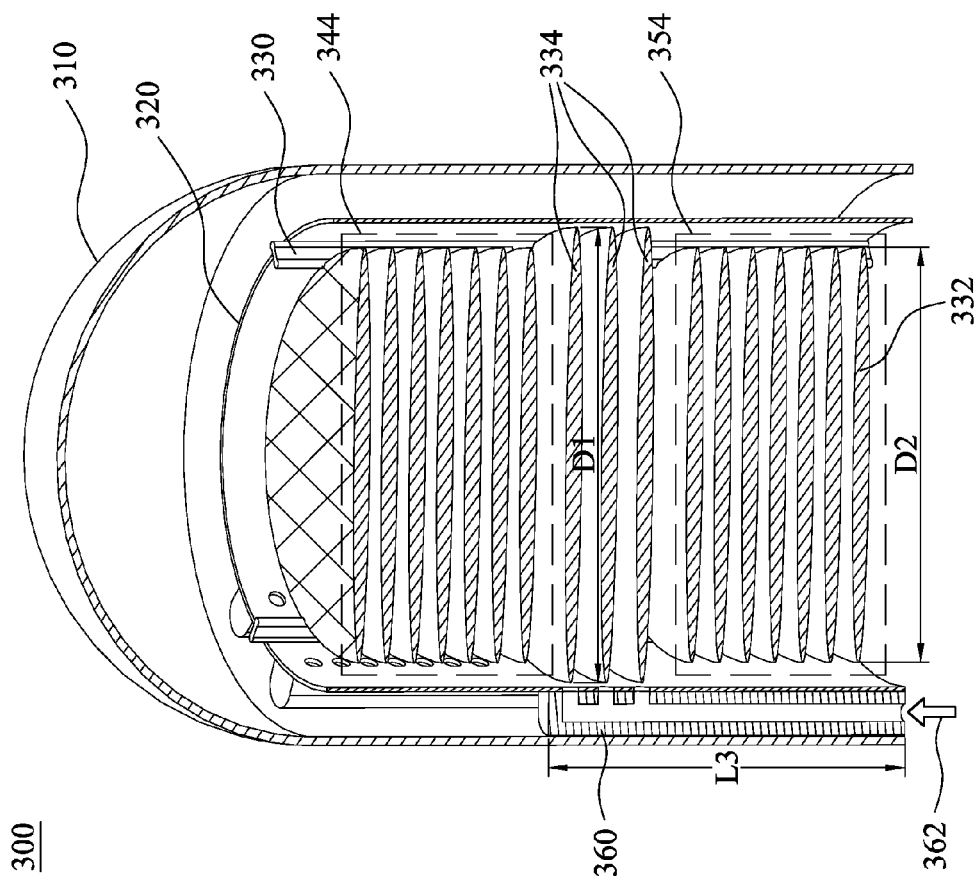
FIG. 3E is a schematic cross-sectional view of a heat treatment apparatus, in accordance with some embodiments.

According to some embodiments, as shown in FIG. 3E, the inactive gas injector 360 is positioned between the outer tube 310 and the inner tube 320. The inactive gas injector 360 is arranged between the first processing zone 344 and the second processing zone 354, for supplying an inactive gas 362 into the inner tube 320. According to some embodiments, the inactive gas is a noble gas including, but not limited to, nitrogen ($N_2$), helium (He), neon (Ne), argon (Ar), krypton (Kr), xenon (Xe) or a combination thereof.

Referring to FIGS. 3C-3E, the inactive gas injector 360 is arranged between the first gas injector 340 and the second gas injector 350. The length (L3) of the inactive gas injector 360 is in a range between the first gas injector 340 and the second gas injector 350, so that the first processing zone 344 and the second processing zone 354 are separated by the inactive gas 362.

Further, in FIG. 3E, the wafer carrier 330 includes a dummy wafer 334. The dummy wafer 334 is positioned between the first processing zone 344 and the second processing zone 354, so that the first processing zone 344 and the second processing zone 354 are separated from each other. According to some embodiments, the dummy wafer 334 is fixed on the wafer carrier 330, and is between the first processing zone 344 and the second processing zone 354. According to some embodiments, a diameter (D1) of the dummy wafer 334 is greater than or equal to a diameter (D2) of the process wafers 332.

According to some embodiments, as the first processing zone and the second processing zone are separated from each other in the same heat treatment apparatus, a process wafer in the first processing zone may be performed a different process from another process wafer in the second processing zone at the same time.

Figure 4:
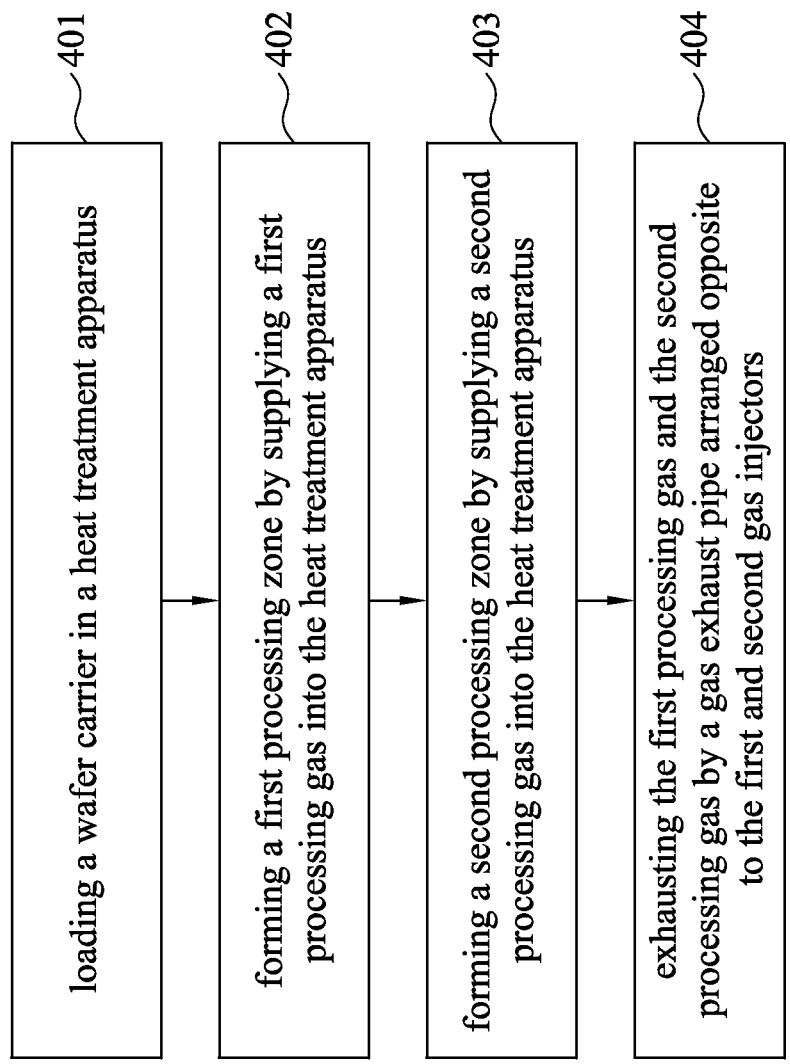
FIG. 4 is a flow chart illustrating methods of processing wafers, in accordance with some embodiments.

FIG. 4 is a flow chart illustrating a method of processing wafers, in accordance with some embodiments. The operations 401 to 404 are disclosed in association with the cross-sectional views of the heat treatment apparatus 300 from FIGS. 3C-3E, in accordance with some embodiments.

In the operation 401, the wafer carrier 330 is loaded in the heat treatment apparatus 300. The wafer carrier 330 includes a first process wafer for a first process and a second process wafer for a second process.

In the operation 402, the first processing zone 344 is formed by supplying the first processing gas 342 into the heat treatment apparatus 300. Referring to FIG. 3C, the first processing gas 342 is supplied form the first gas injector 340 to form the first processing zone 344 in the inner tube 320. According to some embodiments, the first processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

In the operation 403, the second processing zone 354 is formed by supplying the second processing gas 352 into the heat treatment apparatus 300. Referring to FIG. 3D, the second processing gas 352 is supplied from the second gas injector 350 to form the second processing zone 354 in the inner tube 320. According to some embodiments, the second processing gas includes, but not limited to, argon (Ar), hydrogen ($H_2$), oxygen ($O_2$), ozone ($O_3$), water vapor ($H_2O$), nitrogen ($N_2$), ammonia ($NH_3$), nitric oxide (NO), nitrous oxide ($N_2O$), hydrogen chloride (HCl), dichlorosilane (Si2H2Cl2) or a combination thereof.

Referring to the operations 402 and 403, the first process wafer is positioned in the first processing zone 344, the second process wafer is positioned in the second processing zone 354, and the first processing zone 344 and the second processing zone 354 are virtually formed to separate from each other.

In the operation 404, the first processing gas 342 and the second processing gas 352 are exhausted by the gas exhaust holes 370. The gas exhaust holes 370 are arranged opposite to the first gas injector 340 and the second gas injector 350. Referring to FIG. 3C, the gas exhaust holes 370 are on inner tube 320. According to some embodiments, the gas exhaust holes 370 are arranged opposite to the first gas injector 340, for exhausting the first processing gas 342. According to some embodiments, as the first processing zone and the second processing zone are separated from each other in the same heat treatment apparatus, the first process wafer in the first processing zone may be performed a different process from the second process wafer in the second processing zone at the same time.

Figure 5:
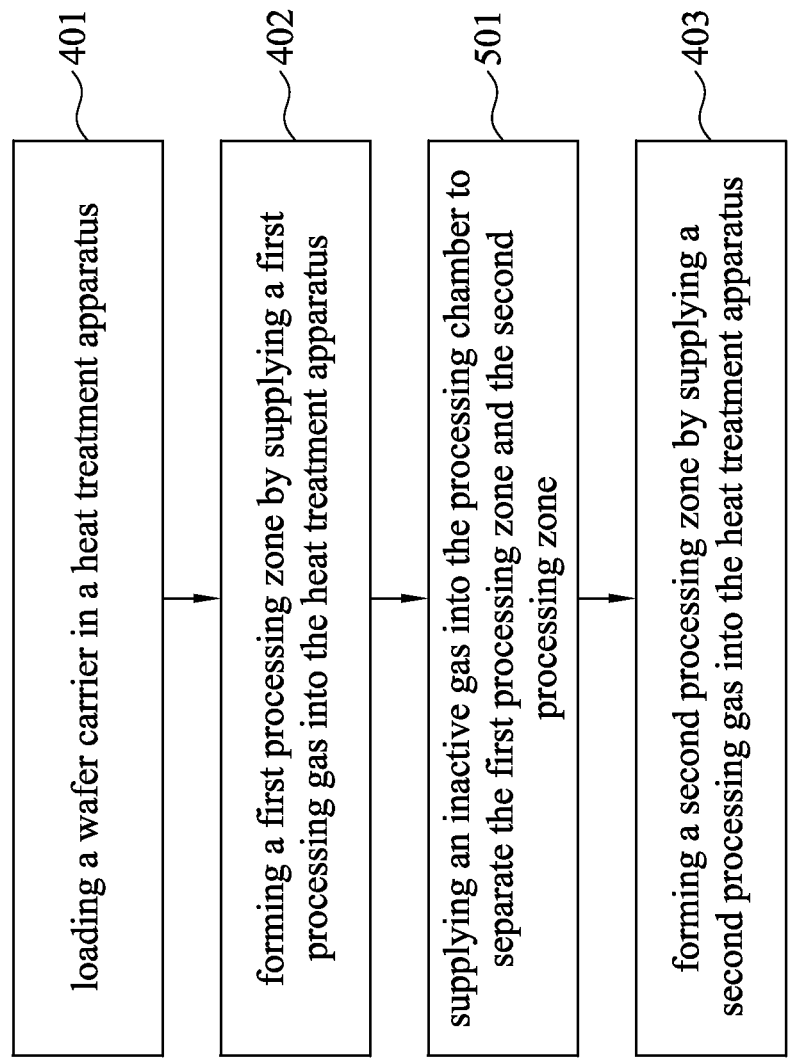
FIG. 5 is a flow chart illustrating methods of processing wafers, in accordance with some embodiments.

FIG. 5 is a flow chart illustrating a method of processing wafers, in accordance with some embodiments. The operations 401-403 and 501 are disclosed in association with the cross-sectional views of the heat treatment apparatus 300 from FIGS. 3C-3E, in accordance with some embodiments.

In the operation 401, the wafer carrier 330 is loaded in the heat treatment apparatus 300. The wafer carrier 330 includes a first process wafer for a first process and a second process wafer for a second process.

In the operation 402, the first processing zone 344 is formed by supplying the first processing gas 342 into the heat treatment apparatus 300.

In the operation 501, the inactive gas 362 is supplied into the heat treatment apparatus 300 to separate the first processing zone 344 and the second processing zone 354. Referring to FIG. 3E, the inactive gas 362 is supplied from the inactive gas injector 360 which is arranged between the first processing zone 344 and the second processing zone 354, so as to separate the first processing zone 344 and the second processing zone 354. According to some embodiments, the inactive gas is a noble gas including, but not limited to, nitrogen ($N_2$), helium (He), neon (Ne), argon (Ar), krypton (Kr), xenon (Xe) or a combination thereof.

In the operation 403, the second processing zone 354 is formed by supplying the second processing gas 352 into the heat treatment apparatus 300.

Referring to the operations 402, 501 and 403, the first process wafer is positioned in the first processing zone 344, the second process wafer is positioned in the second processing zone 354, and the inactive gas injector 360 is arranged between the first processing zone 344 and the second processing zone 354, such that the inactive gas 362 is supplied to separate the first processing zone 344 and the second processing zone 354. According to some embodiments, as the first processing zone and the second processing zone are separated from each other in the same heat treatment apparatus, the first process wafer in the first processing zone may be performed a different process from the second process wafer in the second processing zone at the same time.

Figure 6:
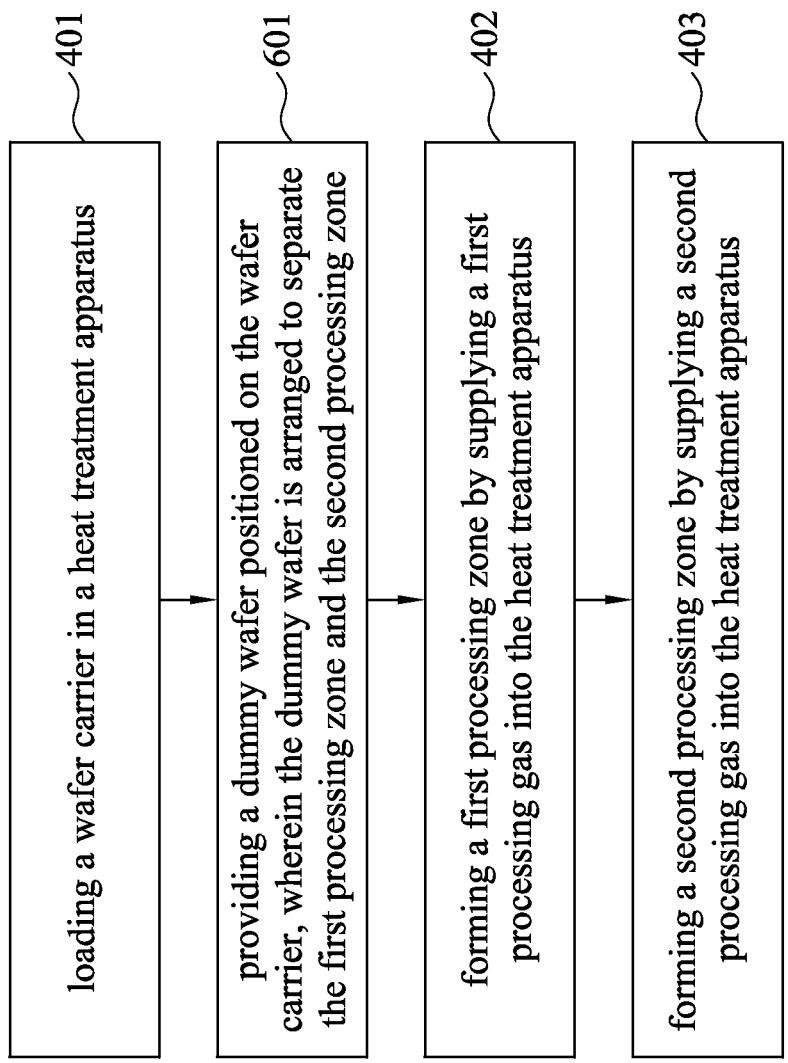
FIG. 6 is a flow chart illustrating methods of processing wafers, in accordance with some embodiments.

FIG. 6 is a flow chart illustrating a method of processing wafers, in accordance with some embodiments. The operations 401-403 and 601 are disclosed in association with the cross-sectional views of the heat treatment apparatus 300 from FIGS. 3C-3E, in accordance with some embodiments.

In the operation 401, the wafer carrier 330 is loaded in the heat treatment apparatus 300. The wafer carrier 330 includes a first process wafer for a first process and a second process wafer for a second process.

In the operation 601, the dummy wafer 334 positioned on the wafer carrier 330 is provided. The dummy wafer 334 is arranged between the first processing zone 355 and the second processing zone 354, so that the first processing zone 344 and the second processing zone 354 are separated from each other. According to some embodiments, providing the dummy wafer is providing a dummy wafer having a diameter greater than the first and second process wafers. Referring to FIG. 3E, the diameter (D1) of the dummy wafer 334 is greater than or equal to the diameter (D2) of the process wafers 332.

In the operation 402, the first processing zone 344 is formed by supplying the first processing gas 342 into the heat treatment apparatus 300.

In the operation 403, the second processing zone 354 is formed by supplying the second processing gas 352 into the heat treatment apparatus 300.

Referring to the operations 601, 402 and 403, the first process wafer is positioned in the first processing zone 344, the second process wafer is positioned in the second processing zone 354, and the dummy wafer 334 is arranged between the first processing zone 355 and the second processing zone 354, so that the first processing zone 344 and the second processing zone 354 are separated from each other. According to some embodiments, as the first processing zone and the second processing zone are separated from each other in the same heat treatment apparatus, the first process wafer in the first processing zone may be performed a different process from the second process wafer in the second processing zone at the same time.

In some embodiments of the present disclosure, a wafer processing chamber includes a first processing gas supply unit and a second processing gas supply unit. The first processing gas supply unit is for supplying a first processing gas into the wafer processing chamber, and the first processing gas forms a first processing zone in the wafer processing chamber. The second processing gas supply unit is for supplying a second processing gas into the wafer processing chamber, and the second processing gas forms a second processing zone in the wafer processing chamber. In the wafer processing chamber, the first processing zone and the second processing zone are virtually separated from each other. In accordance with various embodiments, as the first processing zone and the second processing zone are separated from each other in the same heat treatment apparatus, a process wafer in the first processing zone may be performed a different process from another process wafer in the second processing zone at the same time.

In some embodiments of the present disclosure, a heat treatment apparatus includes an outer tube, an inner tube, a first gas injector and a second gas injector. The inner tube is in the outer tube, configured to accommodate a wafer carrier for holding a plurality of process wafers. The first and second gas injectors are positioned between the outer tube and the inner tube. The first gas injector is for supplying a first processing gas to form a first processing zone in the inner tube. The second gas injector is for supplying a second processing gas to form a second processing zone in the inner tube. In the heat treatment apparatus, the first processing zone and the second processing zone are virtually separated from each other. In accordance with various embodiments, as the first processing zone and the second processing zone are separated from each other in the same heat treatment apparatus, a part of process wafers in the first processing zone may be performed a different process from another part of process wafers in the second processing zone at the same time.

In some embodiments of the present disclosure, a method for processing wafers. The wafer carrier is loaded in the heat treatment apparatus. The wafer carrier includes a first process wafer for a first process and a second process wafer for a second process. The first processing zone is formed by supplying the first processing gas into the heat treatment apparatus. The second processing zone is formed by supplying the second processing gas into the heat treatment apparatus. In the operations of processing wafers, the first process wafer is positioned in the first processing zone, the second process wafer is positioned in the second processing zone, and the first processing zone and the second processing zone are virtually formed to separate from each other. In accordance with various embodiments, as the first processing zone and the second processing zone are separated from each other in the same heat treatment apparatus, the first process wafer in the first processing zone may be performed a different process from the second process wafer in the second processing zone at the same time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wafer processing chamber, comprising:
   a first processing gas supply unit configured for supplying a first processing gas to form a first processing zone; and
   a second processing gas supply unit configured for supplying a second processing gas to form a second processing zone,
   wherein the first processing zone and the second processing zone are virtually separated from each other.

2. The wafer processing chamber of claim 1, further comprising a separation unit arranged between the first processing zone and the second processing zone.

3. The wafer processing chamber of claim 2, wherein the separation unit is an inactive gas supply unit configured for supplying an inactive gas to separate the first processing zone and the second processing zone.

4. The processing chamber of claim 1, wherein the first processing gas supply unit and the second processing gas supply unit are arranged vertically and horizontally.

5. The processing chamber of claim 1, further comprising a gas exhaust unit formed opposite to the first and second processing gas supply unit, and configured for exhausting the first processing gas and the second processing gas.

6. A heat treatment apparatus, comprising:
   an outer tube;
   an inner tube in the outer tube, configured to accommodate a wafer carrier for holding a plurality of process wafers;
   a first gas injector positioned between the outer tube and the inner tube, and configured for supplying a first processing gas to form a first processing zone in the inner tube; and
   a second gas injector positioned between the outer tube and the inner tube, and configured for supplying a second processing gas to form a second processing zone in the inner tube,
   wherein the first processing zone and the second processing zone are virtually separated from each other.

7. The heat treatment apparatus of claim 6, wherein the first gas injector and the second gas injector are arranged vertically, and the first gas injector is higher than the second gas injector.

8. The heat treatment apparatus of claim 7, wherein a length of the first gas injector is longer than that of the second gas injector.

9. The heat treatment apparatus of claim 8, further comprising an inactive gas injector positioned between the outer tube and the inner tube and arranged between the first and second processing zones, and configured for supplying an inactive gas into the inner tube.

10. The heat treatment apparatus of claim 9, wherein a length of the inactive gas injector is in a range between the first gas injector and the second gas injector.

11. The heat treatment apparatus of claim 10, wherein the wafer carrier further comprises a dummy wafer positioned thereon and between the first processing zone and the second processing zone.

12. The heat treatment apparatus of claim 11, wherein the dummy wafer is fixed on the wafer carrier, and is between the first processing zone and the second processing zone.

13. The heat treatment apparatus of claim 11, wherein a diameter of the dummy wafer is greater than or equal to the process wafers.

14. The heat treatment apparatus of claim 6, further comprising a plurality of gas exhaust holes on the inner tube beside each process wafer and formed opposite to the first and second gas injectors, and configured for exhausting the first processing gas and the second processing gas.

15. A method for processing wafers, comprising:
   loading a wafer carrier in a heat treatment apparatus, wherein the wafer carrier comprises a first process wafer for a first process and a second process wafer for a second process;
   forming a first processing zone by supplying a first processing gas into the heat treatment apparatus; and
   forming a second processing zone by supplying a second processing gas into the heat treatment apparatus,
   wherein the first process wafer is positioned in the first processing zone, the second process wafer is positioned in the second processing zone, and the first processing zone and the second processing zone are virtually formed to separate from each other.

16. The method for processing wafers according to claim 15, further comprising supplying an inactive gas into the heat treatment apparatus to separate the first processing zone and the second processing zone.

17. The method for processing wafers according to claim 15, wherein the first processing gas is supplied from a first gas injector; and the second processing gas is supplied from a second gas injector.

18. The method for processing wafers according to claim 17, further comprising exhausting the first processing gas and the second processing gas by a plurality of gas exhaust holes arranged opposite to the first and second gas injectors.

19. The method for processing wafers according to claim 15, further comprising providing a dummy wafer positioned on the wafer carrier, wherein the dummy wafer is arranged to separate the first processing zone and the second processing zone.

20. The method for processing wafers according to claim 19, wherein providing the dummy wafer is providing a dummy wafer having a diameter greater than the first and second process wafers.

* * * * *